United States Patent
Lin et al.

(10) Patent No.: US 11,737,287 B2
(45) Date of Patent: Aug. 22, 2023

(54) MEMORY DEVICE, METHOD OF FORMING THE SAME, AND SEMICONDUCTOR DEVICE HAVING THE SAME

(71) Applicant: Taiwan Semiconductor Manufacturing Company, Ltd., Hsinchu (TW)

(72) Inventors: Yu-Chao Lin, Hsinchu (TW); Jung-Piao Chiu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 49 days.

(21) Appl. No.: 17/238,212

(22) Filed: Apr. 23, 2021

(65) Prior Publication Data

US 2022/0344403 A1 Oct. 27, 2022

(51) Int. Cl.
| | |
|---|---|
| *H10B 63/00* | (2023.01) |
| *H10B 53/30* | (2023.01) |
| *H10B 61/00* | (2023.01) |
| *H10N 50/01* | (2023.01) |
| *H10N 70/00* | (2023.01) |

(52) U.S. Cl.
CPC .............. *H10B 63/24* (2023.02); *H10B 53/30* (2023.02); *H10B 61/10* (2023.02); *H10N 50/01* (2023.02); *H10N 70/063* (2023.02)

(58) Field of Classification Search
CPC ....................................................... H10B 63/24
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2018/0315474 A1* | 11/2018 | Redaelli | G11C 13/0026 |
| 2019/0221608 A1* | 7/2019 | Kar | H01L 27/228 |

* cited by examiner

Primary Examiner — Mounir S Amer
(74) Attorney, Agent, or Firm — JCIPRNET

(57) ABSTRACT

Provided are a memory device and a method of forming the same. The memory device includes a plurality of bit lines extending along a first direction; a plurality of word lines extending along a second direction different from the first direction; a plurality of memory pillars; and a selector. The plurality of word lines are disposed over the plurality of bit lines. The plurality of memory pillars are disposed between the plurality of bit lines and the plurality of word lines, and respectively positioned at a plurality of intersections of the plurality of bit lines and the plurality of word lines. The selector is disposed between the plurality of memory pillar and the plurality of word lines. The selector extends from a top surface of one memory pillar to cover a top surface of an adjacent memory pillar. A semiconductor device having the memory device is also provided.

20 Claims, 15 Drawing Sheets

MEMORY DEVICE, METHOD OF FORMING THE SAME, AND SEMICONDUCTOR DEVICE HAVING THE SAME

BACKGROUND

Many modern day electronic devices contain electronic memory. Electronic memory may be volatile memory or non-volatile memory. Non-volatile memory is able to store data in the absence of power, whereas volatile memory is not. Some examples of next generation electronic memory include resistive random-access memory (RRAM), phase-change random-access memory (PCRAM), magnetoresistive random-access memory (MRAM), or the like. In some next generation electronic memory, selectors are coupled to memory cells to mitigate the negative effects (e.g., sneak paths) associated with scaling down the feature size of next generation electronic memory. However, the sidewalls of the selectors may be suffered the etching damage in the patterning process of forming the memory cells, thereby affecting the performance of the selectors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
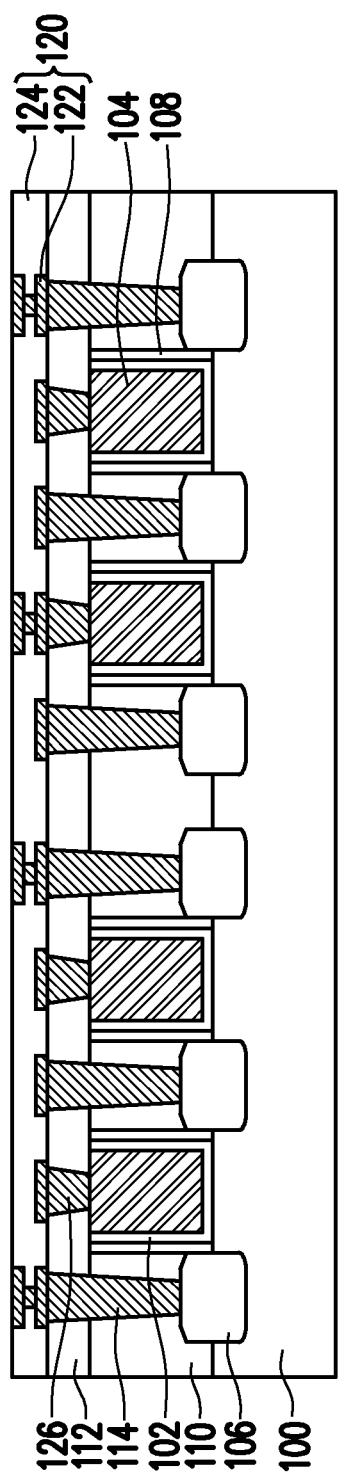
FIGS. 1, 2, 3A, 3B, 4, 5A, 5B, 6A, 6B, 7A, 7B, 8A, 8B, 9A, and 9B illustrate the cross-sectional views and perspective schematic views of intermediate stages in the formation of a semiconductor device including memory pillars in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, the selector is formed after the memory pillars are formed. Therefore, the sidewall of the selector will not suffer the etching damage in the patterning process of forming the memory pillars. In this case, the selector can have the desirable electrical properties (e.g., prevent leakage current and/or have a functional threshold voltage), thereby improving the performance of the memory device with the high density cross-bar structure.

FIGS. 1, 2, 3A, 3B, 4, 5A, 5B, 6A, 6B, 7A, 7B, 8A, 8B, 9A, and 9B illustrate the cross-sectional views and perspective schematic views of intermediate stages in the formation of a semiconductor device including memory pillars in accordance with some embodiments.

Figure 9A:
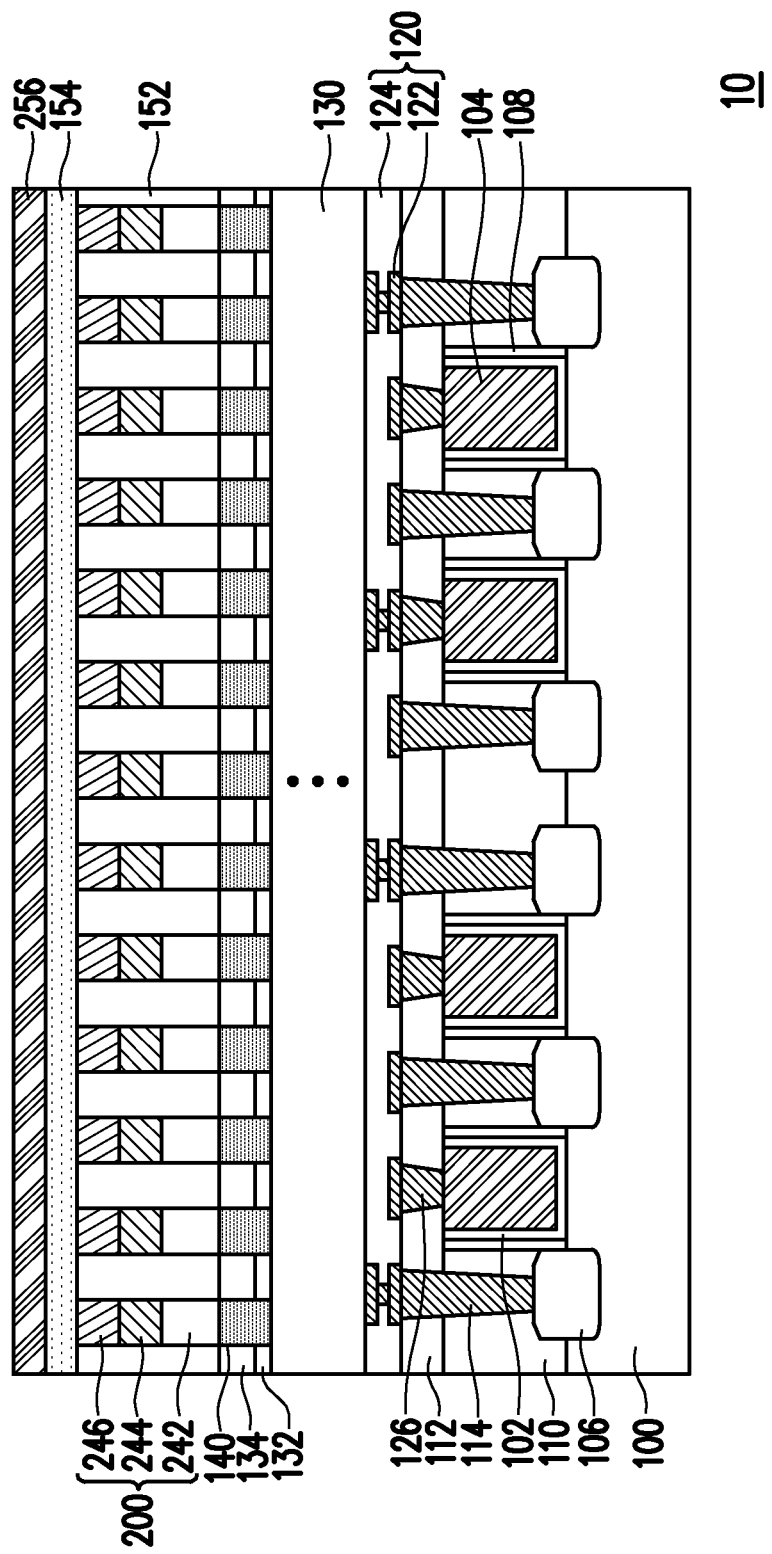

Referring to FIG. 1, a method of forming a semiconductor device 10 having a plurality of memory cells 200 (as shown in FIG. 9A) includes following steps. First, an initial structure illustrated in FIG. 1 is provided. The initial structure includes a substrate 100. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be an integrated circuit die, such as a logic die, a memory die, an ASIC die, or the like. The substrate 100 may be a complementary metal oxide semiconductor (CMOS) die and may be referred to as a CMOS under array (CUA). The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The initial structure of FIG. 1 further includes circuits that may be formed over the substrate 100. The circuits include transistors at a top surface of the substrate 100. The transistors may include gate dielectric layers 102 over top surfaces of the substrate 100 and gate electrodes 104 over the gate dielectric layers 102. Source/drain regions 106 are disposed in the substrate 100 on opposite sides of the gate dielectric layers 102 and the gate electrodes 104. Gate spacers 108 are formed along sidewalls of the gate dielectric layers 102 and separate the source/drain regions 106 from the gate electrodes 104 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 110 surrounds and isolates the source/drain regions 106, the gate dielectric layers 102, and the gate electrodes 104 and a second ILD 112 is over the first ILD 110. Source/drain contacts 114 extend through the second ILD 112 and the first ILD 110 and are electrically coupled to the source/drain regions 106 and gate contacts 116 extend through the second ILD 112 and are electrically coupled to the gate electrodes 104. A first interconnect structure 120 is over the second ILD 112, the source/drain contacts 114, and the gate contacts 116. The first interconnect structure 120 includes one or more stacked dielectric layers (e.g., inter-metal dielectric (IMD) layer) 124 and conductive features (e.g., conductive lines and vias) 122 formed in the one or more dielectric layers 124, for example. The first interconnect structure 120 may be electrically connected to the gate contacts 116 and the source/drain contacts 114 to form functional circuits. In some embodiments, the functional circuits formed by the first interconnect structure 120 may include logic circuits, memory circuits, sense amplifiers, controllers, input/output circuits, image sensor circuits, the like, or combinations thereof. Although FIG. 1 discusses transistors formed over the substrate 100, other active devices (e.g., diodes or the like) and/or passive devices (e.g., capacitors, resistors, or the like) may also be formed as part of the functional circuits.

Figure 2:
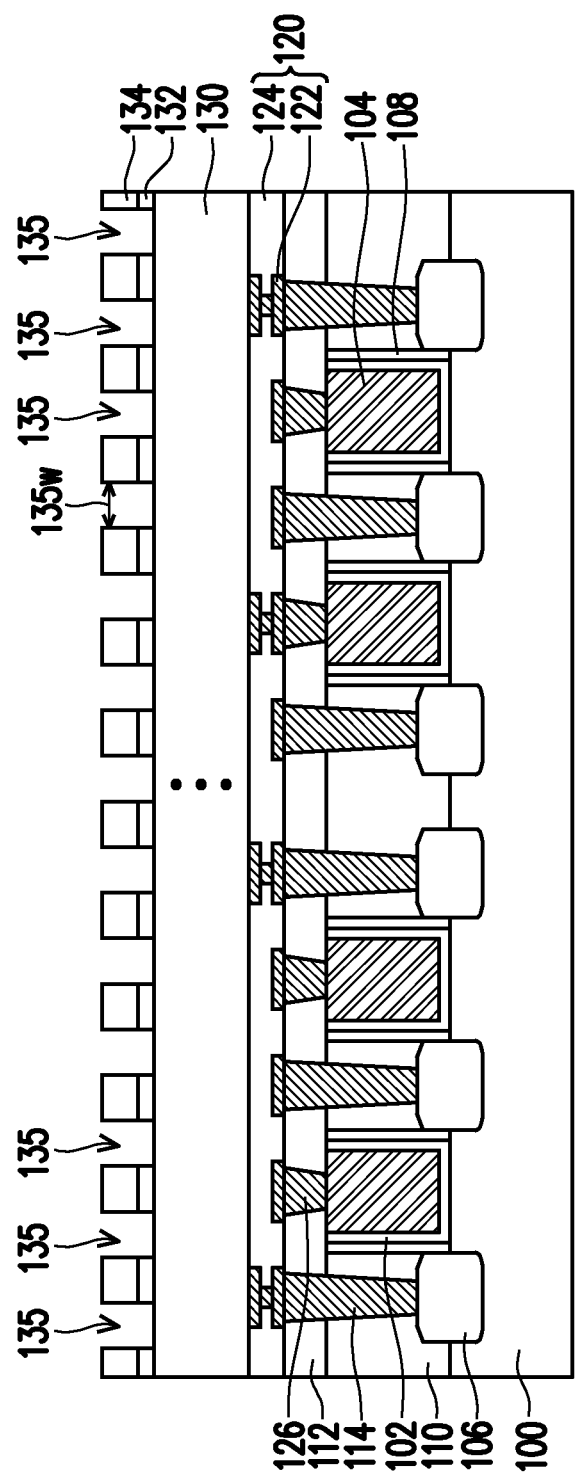

Referring to FIG. 2, after forming the first interconnect structure 120, a second interconnect structure 130 is formed on the first interconnect structure 120. In some embodiments, the second interconnect structure 130 includes one or more stacked dielectric layers (e.g., inter-metal dielectric (IMD) layer) and conductive features (e.g., conductive lines and vias) formed in the one or more dielectric layers, for example. The second interconnect structure 130 may be electrically connected to the underlying first interconnect structure 120 and to-be-formed bit lines 140 thereon.

In FIG. 2, a first dielectric material 132 is then formed on the second interconnect structure 130. The first dielectric material 132 may be referred to as an etching stop layer. In such embodiment, the first dielectric material 132 includes silicon carbide, silicon nitride, or the like, and may be formed by any suitable method, such as chemical vapor deposition (CVD), spin-on, or the like.

Thereafter, a second dielectric material 134 is formed on the first dielectric material 132. In some embodiments, the second dielectric material 134 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the second dielectric material 134 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the second dielectric material 134 include one or more dielectric materials. In some embodiments, the second dielectric material 134 is formed by any suitable method, such as CVD, spin-on, or the like. In the embodiment, the second dielectric material 134 and the first dielectric material 132 have different materials. For example, the first dielectric material 132 may be made of silicon nitride, and the second dielectric material 134 may be made of silicon oxide.

Afterward, an etching process is performed to remove a portion of the first dielectric material 132 and a portion of the second dielectric material 134, thereby forming a plurality of trenches 135 in the first dielectric material 132 and the second dielectric material 134. As shown in FIG. 2, the trenches 135 expose portions of the second interconnect structure 130. In some embodiments, the etching process includes a dry etching process, such as a reactive ion etching (RIE) process. The first dielectric material 132 and the second dielectric material 134 may have different etching selectivities. In the case, the first dielectric material 132 may prevent the underlying second interconnect structure 130 from damage caused by the over-etching in the etching process. In some embodiments, the trench 135 has a width 135$w$ in a range of 20 nm to 50 nm, such as 20 nm. However, the embodiments of the present disclosure are not limited thereto. In other embodiments, the width 135$w$ of the trench 135 may be less than 20 nm to achieve higher density.

Figure 3A:
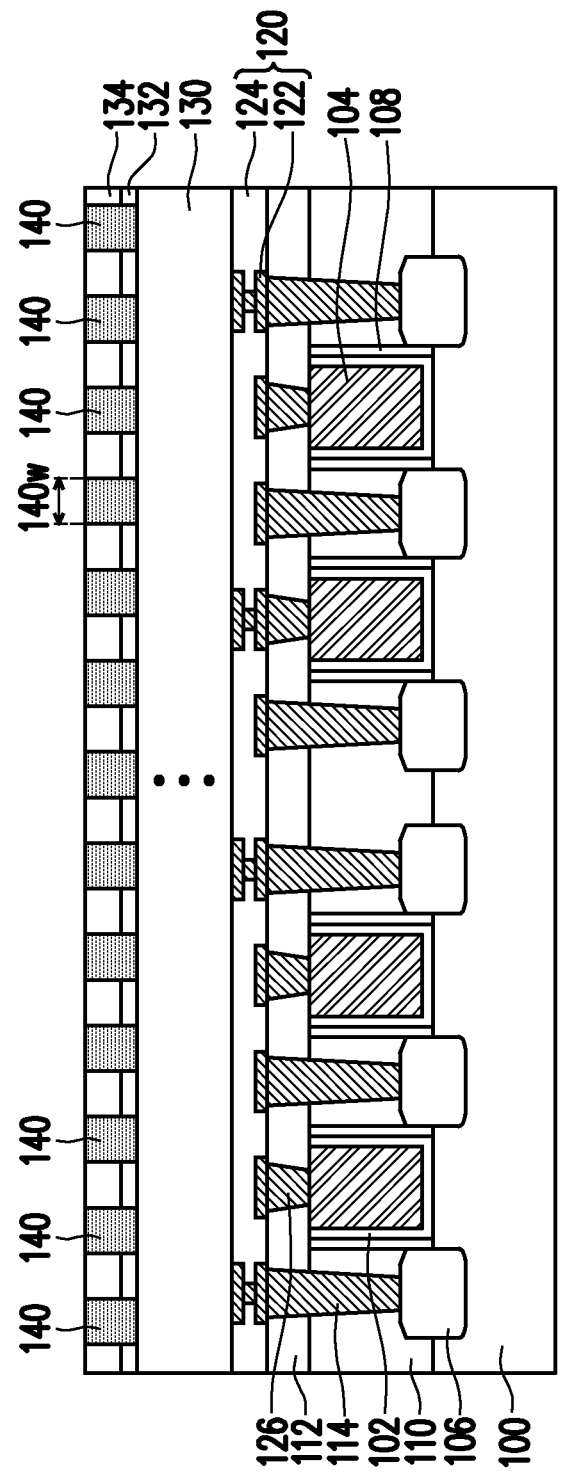
Figure 3B:
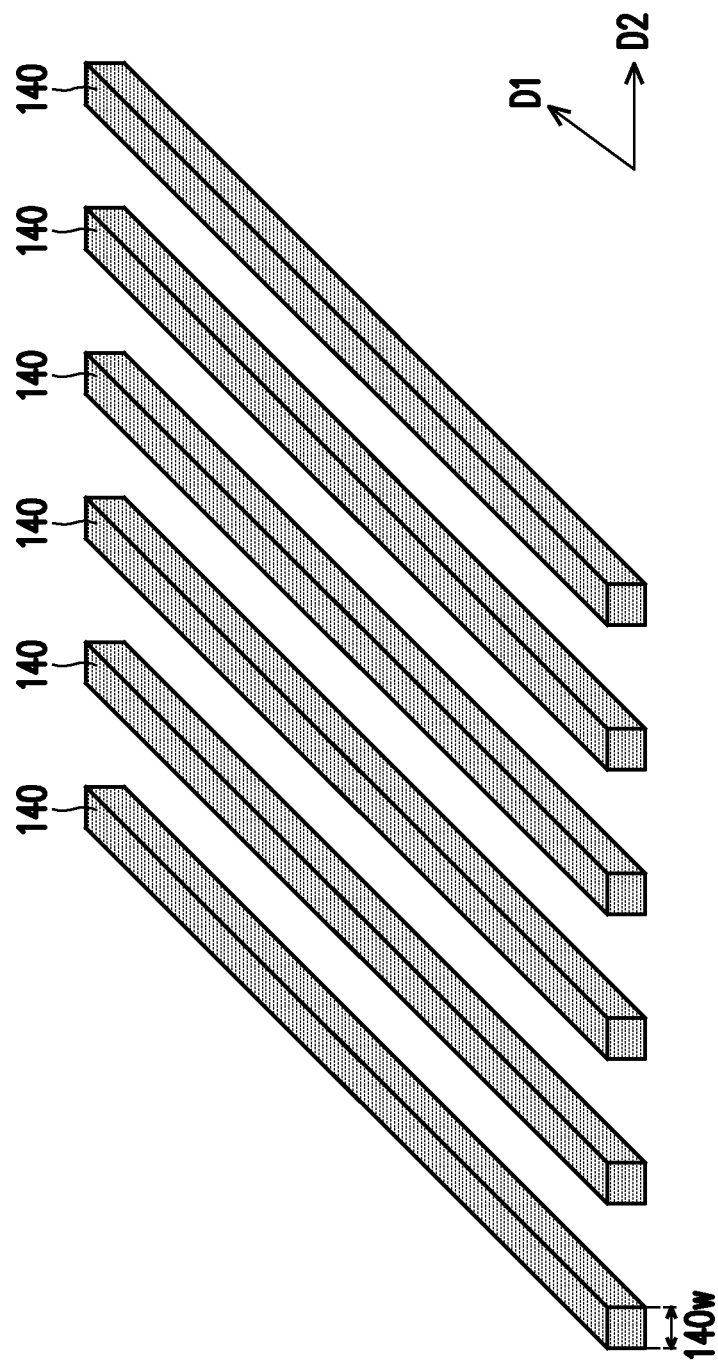

Referring to FIG. 3A, a plurality of bit lines 140 are respectively formed in the trenches 135. In some embodiments, the bit lines 140 are formed by a single damascene process including following steps. First, a conductive material is formed to fill in the trenches 135 and cover the top surface of the second dielectric material 134. Thereafter, a planarization process (e.g., a CMP process) is performed to remove excessive conductive material, thereby forming the bit lines 140. In some embodiments, the bit lines 140 include a conductive material, such as Ti, Co, Cu, AlCu, W, TiN, TiW, TiAl, TiAlN, Ru, $RuO_x$, or a combination thereof. In some embodiments, the bit line 140 has a width 140$w$ in a range of 20 nm to 50 nm, such as 20 nm. However, the embodiments of the present disclosure are not limited thereto. In other embodiments, the width 140$w$ of the bit line 140 may be less than 20 nm to achieve higher density. In addition, as shown in FIG. 3B, the bit lines 140 extend along a first direction D1 and spaced from each other in a second direction D2. In some embodiments, the first direction D1 is perpendicular to the second direction D2. The perspective schematic view of FIG. 3B only illustrates the bit lines 140, and other components are omitted.

Figure 4:
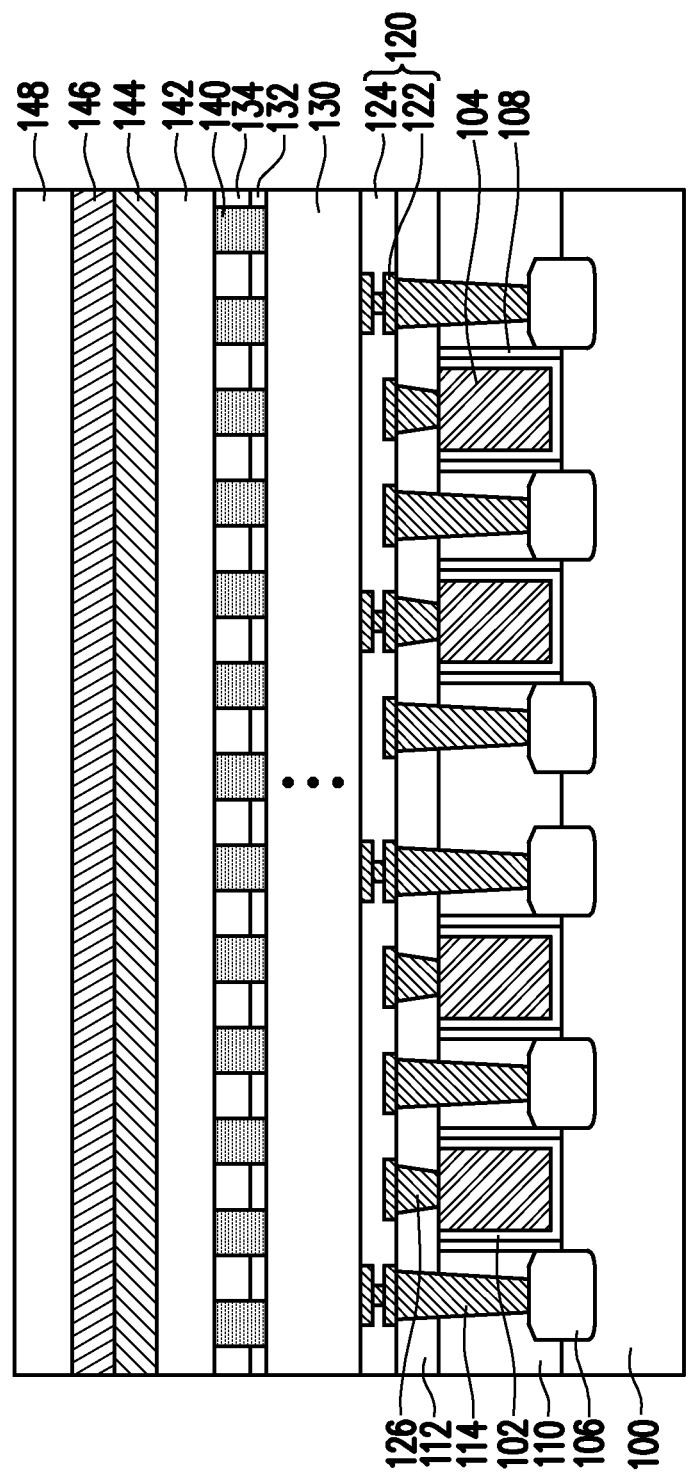

Referring to FIG. 4, a storage element material 142, an electrode material 144, a buffer metal material 146, and a sacrificial material 148 are sequentially formed on the bit lines 140 and the second dielectric material 134. In some embodiments, the storage element material 142 includes a phase change material when the memory cell 200 (FIG. 9A) is a phase change memory (PCM) cell. The phase change material may include a chalcogenide material, such as an indium (In)-antimony (Sb)-tellurium (Te) (IST) material or a germanium (Ge)-antimony (Sb)-tellurium (Te) (GST) material. The ISG material may include $In_2Sb_2Te_5$, $In_1Sb_2Te_4$, $In_1Sb_4Te_7$, or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other storage element materials include transition metal oxide materials or alloys including two or more metals, such as transition metals, alkaline earth metals, and/or rare earth metals. The storage element material 142 may be formed by any suitable method, such as PVD, atomic layer deposition (ALD), or the like. The storage element material 142 may have a thickness of about 20 nm to about 50 nm.

Embodiments are not limited to a particular storage element material or materials associated with the storage elements of the PCM cell. In some alternative embodiments, the storage element material is used for a resistive random-access memory (RRAM) cell, a magnetoresistive random-access memory (MRAM) cell, a ferroelectric random-access memory (FeRAM) cell, or a combination thereof.

In some embodiments, the storage element material 142 includes a resistive material when the memory cell 200 (FIG. 9A) is a RRAM cell. The resistive material may include metal oxide, such as hafnium oxide, zirconium oxide, aluminum oxide, nickel oxide, tantalum oxide, titanium oxide, and other suitable oxides, or a combination thereof. The metal oxide may have a non-stoichiometric oxygen to metal ratio. Depending on the method of deposition, the oxygen to metal ratio and other process conditions may be tuned to achieve specific resistive material layer properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistive material layer is a metal oxynitride.

In some embodiments, the storage element material 142 includes one or more magnetic tunnel junction (MTJ) layers when the memory cell 200 (FIG. 9A) is a MRAM cell. The MTJ layer may include various layers formed of different combinations of materials. In some embodiments, the MTJ layer include a pinning layer, a tunnel barrier layer, and a free layer. In addition, the MTJ layer may have other variations including other layers, such as anti-ferro-magnetic layers. In some embodiments, the pinning layer is formed of PtMn, the tunnel barrier layer is formed of MgO, and the free layer is formed of CoFeB. The magnetic moment of the free layer may be programmed causing the resistance of the resulting MTJ cell to be changed between a high resistance and a low resistance. It is realized that MTJ layer may have many variations, which are also within the scope of the present disclosure.

In some embodiments, the storage element material 142 includes a ferroelectric material when the memory cell 200 (FIG. 9A) is a FeRAM cell. The ferroelectric material may include HZO, HSO, HfSiO, HfLaO, $HfO_2$, $HfZrO_2$, $ZrO_2$, or $HfO_2$ doped by La, Y, Si, or Ge, and may be formed by PVD, CVD, ALD, or the like. In some alternative embodiments, the ferroelectric material may be a high-k dielectric material, such as a hafnium (Hf) based dielectric material, or the like. By doping these dopants in the hafnium-comprising compound, an orthorhombic lattice structure can be achieved in the ferroelectric material. In such embodiment, the ferroelectric material can be capable of switching between two different polarization directions by applying an appropriate voltage differential across the ferroelectric material. For example, the polarization of the ferroelectric material may change due to an electric field resulting from applying the voltage differential.

Figure 8A:
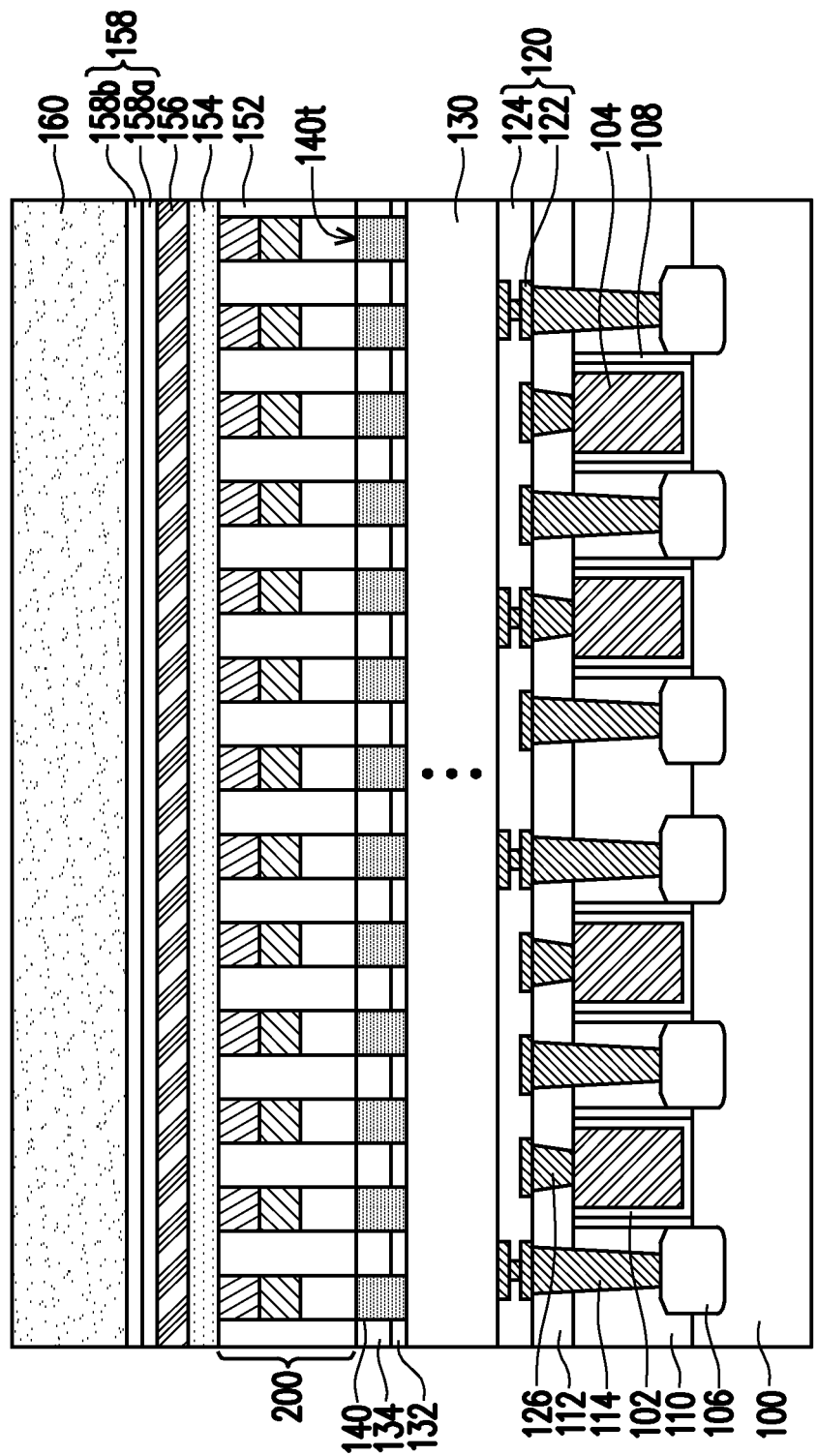

In some embodiments, the electrode material 144 includes a conductive material, such as Ti, Co, Cu, AlCu, W, TiN, TiW, TiAl, TiAlN, or a combination thereof, and may be formed by any suitable method, such as CVD, PVD, or the like. The electrode material 144 may have a thickness of about 5 nm to about 20 nm. In some embodiments, the buffer metal material 146 includes a conductive material, such as Ti, Co, Cu, AlCu, W, TiN, TiW, TiAl, TiAlN, or a combination thereof, and may be formed by any suitable method, such as CVD, PVD, or the like. The buffer metal material 146 may have a thickness of about 5 nm to about 20 nm. In the embodiment, the electrode material 144 and the buffer metal material 146 have different materials. For example, the electrode material 144 is made of TiN, and the buffer metal material 146 is made of W. In such embodiment, the buffer metal material 146 may be referred to as a glue layer to improve the adhesion between electrode material 144 and the subsequently formed selector 154 (FIG. 8A). In some alternative embodiments, the buffer metal material 146 is able to avoid the electrical breakdown issue. In addition, the electrode material 144 may also be referred to as a glue layer to improve the adhesion between the storage element material 142 and the buffer metal material 146, and further avoid the peeling issue between storage element material 142 and the buffer metal material 146.

In some embodiments, the sacrificial material 148 includes a dielectric material, such as silicon oxide, silicon nitride, silicon oxynitride, or a combination thereof, and may be formed by any suitable method, such as CVD, spin-on, or the like. In the exemplary embodiment, the sacrificial material 148 is made of silicon oxide.

Figure 5A:
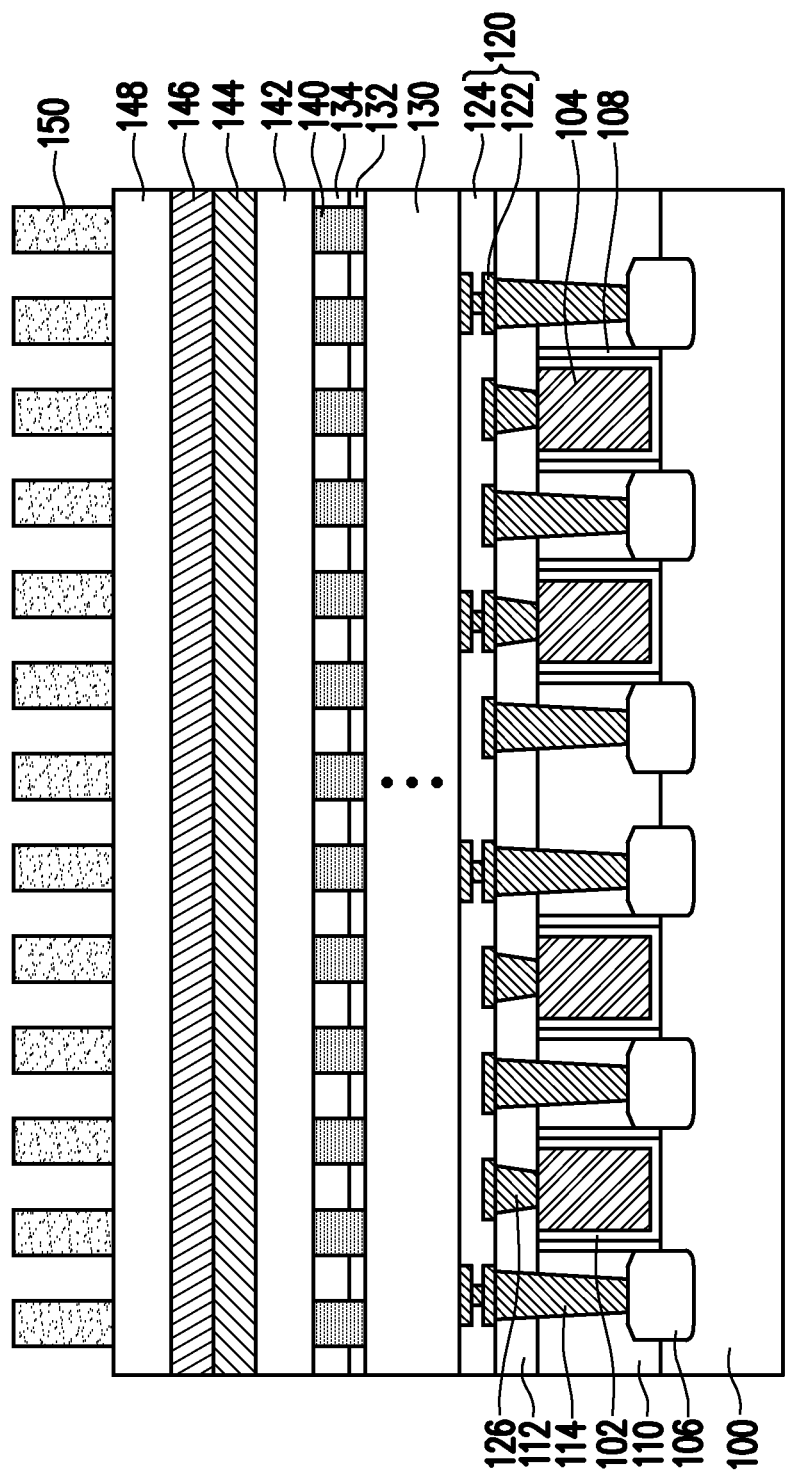
Figure 5B:
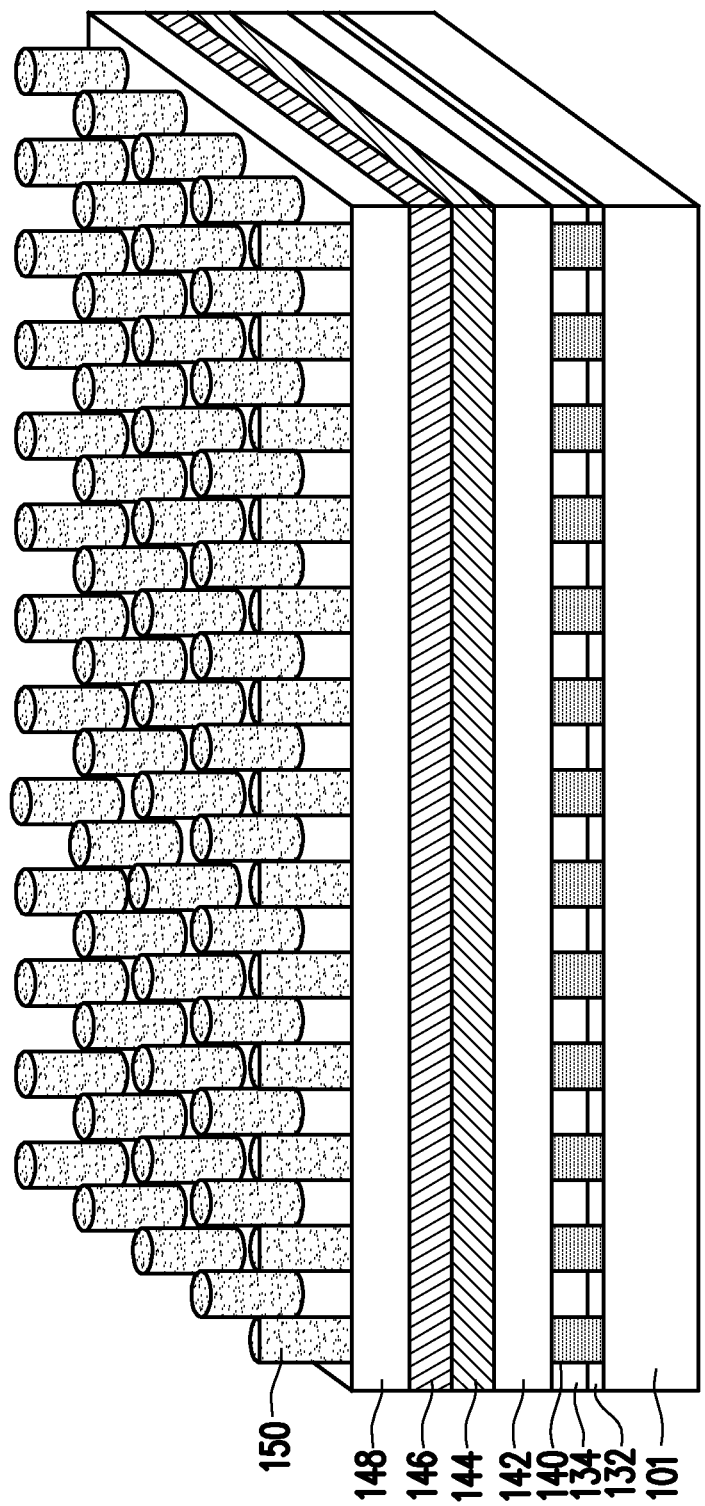

Referring to FIG. 5A, a mask pattern 150 is formed on the sacrificial material 148. Specifically, as shown in perspective schematic view of FIG. 5B, the mask pattern 150 may include a plurality of pillar patterns arranged as an array with a plurality of rows (e.g., along the second direction D2) and a plurality of columns (e.g., along the first direction D1). The array configuration shown in FIG. 5B is only an example, and the embodiment of the present invention is not limited thereto. In other embodiments, the number of the rows and columns can be adjusted according to design requirements. In the embodiment, each of the pillar patterns respectively corresponds the underlying bit lines 140, so that the subsequently formed memory pillars 200 (FIG. 6A) are landed on the underlying bit lines 140. In some embodiments, the mask pattern 150 includes a positive photoresist or a negative photoresist, and may be formed by any suitable method, such as spin-coating. The components in the underlying structure 101 under the bit lines 140 illustrated in FIG. 5B are omitted for clarity.

Figure 6A:
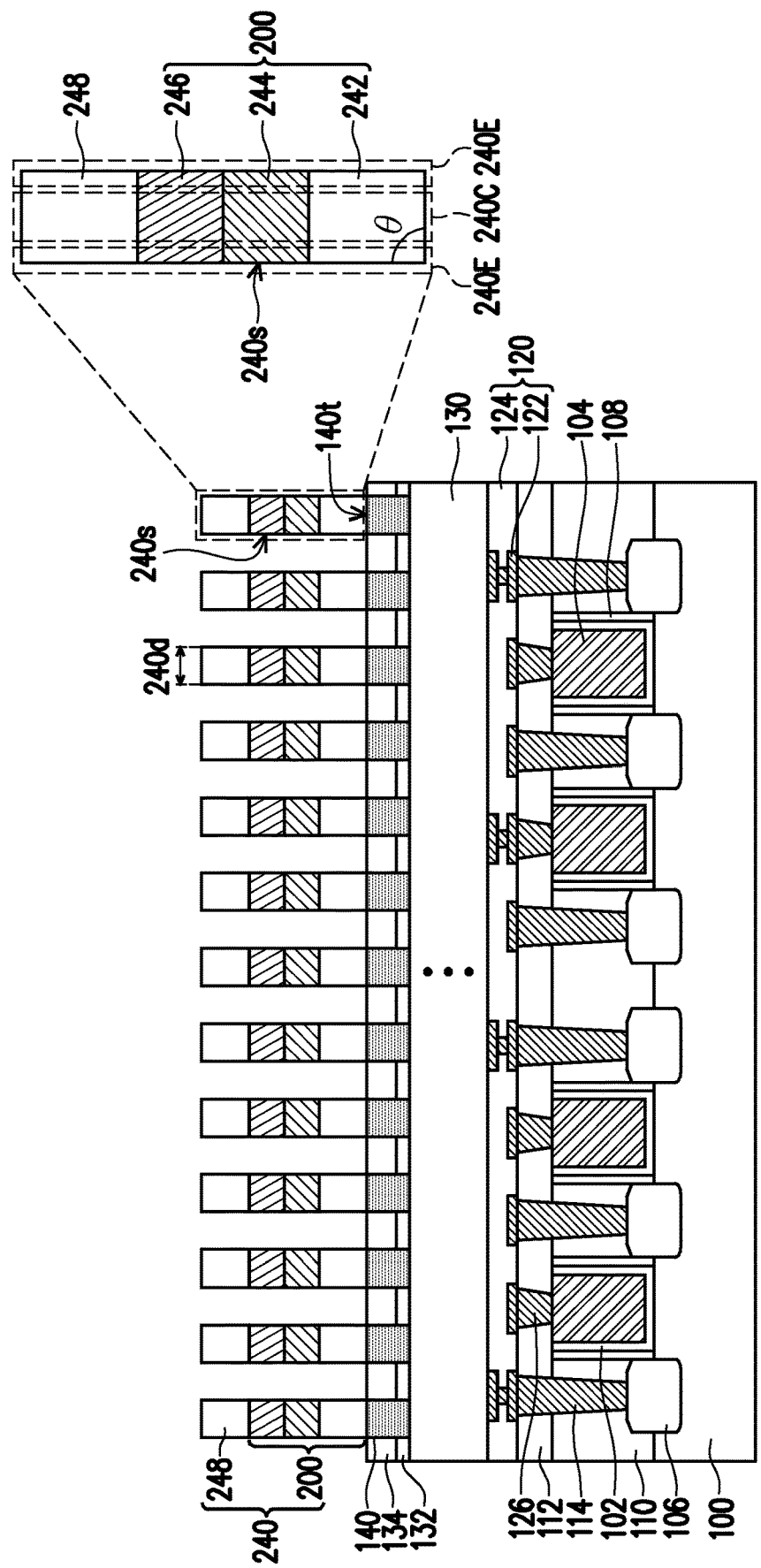

Referring to FIG. 6A, the sacrificial material 148, the buffer metal material 146, the electrode material 144, and the storage element material 142 are patterned by using the mask pattern 150 as a mask, so as to form a plurality of pillar structures 240 respectively standing on the bit lines 140. As shown in the perspective view of FIG. 6B, the pillar structures 240 may be arranged as an array with a plurality of rows (e.g., along the second direction D2) and a plurality of columns (e.g., along the first direction D1). In some embodiments, the pillar structure 240 has a diameter 240d in a range of 20 nm to 50 nm, such as 20 nm. However, the embodiments of the present disclosure are not limited thereto. In other embodiments, the diameter 240d of the pillar structure 240 may be less than 20 nm to achieve higher density. The perspective schematic view of FIG. 6B only illustrates the bit lines 140 and the pillar structures 240, while other components are omitted.

In detail, each of the pillar structures 240 may include a memory pillar 200 and a sacrificial layer 248 on the memory pillar 200. The memory pillar 200 may include a storage element layer 242, an electrode layer 244, and a buffer metal layer 246. The storage element layer 242 may contact the corresponding bit line 140. The electrode layer 244 is disposed on the storage element layer 242. The buffer metal layer 246 is disposed on the electrode layer 244, so that the electrode layer 244 is disposed between the storage element layer 242 and the buffer metal layer 246. In some embodiments, a sidewall of the sacrificial layer 248, a sidewall of the buffer metal layer 246, a sidewall of the electrode layer 244, and a sidewall of the storage element layer 242 are aligned to each other. That is, the pillar structure 240 may have a sidewall 240s perpendicular to the top surface 140t of the bit lines 140. However, the embodiments of the present disclosure are not limited thereto, in some alternative embodiment, the sidewall 240s of the pillar structure 240 may be tapered or curved. That is, an angle θ between the sidewall 240s of the pillar structure 240 and the top surface 140t of the bit lines 140 may be in a range of 75 degree to 90 degree.

Figure 6B:
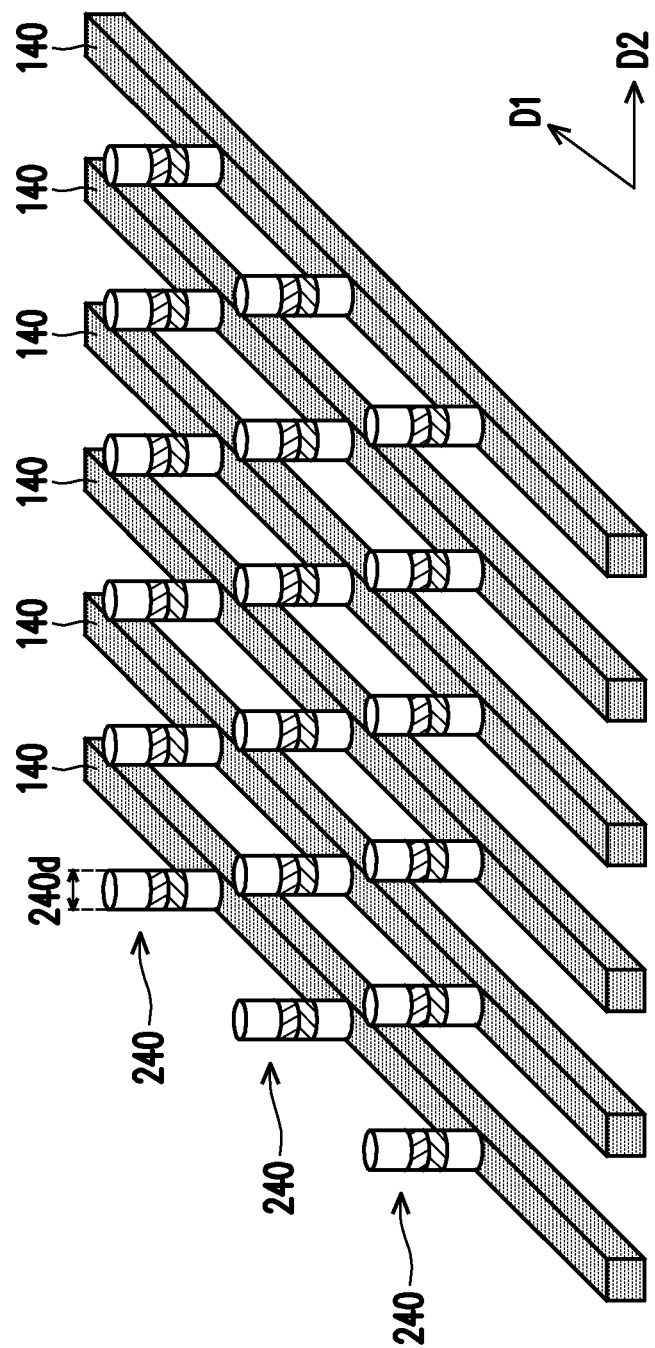

After forming the pillar structures 240, the mask pattern 150 is removed by any suitable method, such as $O_2$ ashing, as shown in FIG. 6A and FIG. 6B. Thereafter, a surface treatment is performed on the pillar structures 240. Specifically, the surface treatment may include a plasma stripping process, a hydrogen reduction process, and a nitridation treatment process. In some embodiments, the plasma stripping process includes introducing a specific ratio of a nitrogen gas and a hydrogen gas, so as to remove some undesired polymer residue remaining on the surface of the pillar structures 240 due to the patterning process or removal process. For example, the ratio of the nitrogen gas to the hydrogen gas may be 2 to 1 (i.e., $N_2:O_2=2:1$). In some embodiments, the hydrogen reduction process includes introducing a hydrogen gas, so as to reduce a metal oxide on the surfaces of the pillar structures 240 to metal. In some embodiments, the nitridation treatment process includes introducing a nitrogen gas, so that the nitrogen gas reacts with metal elements of the surfaces of the pillar structures 240. In this case, a protective layer (not shown) may be formed to be continuously extending or discretely distributed on the surfaces of the pillar structures 240. In such embodiment, the protective layer may provide more protection for the memory pillars from attacking by the moisture and/or harmful gas, thereby maintaining the switchable performance of the memory pillars 200. In addition, since the memory pillars 200 is covered by the protective layer before forming the overlying IMD layer, the queue time (Q-time) of the exposed memory pillars 200 are able to be prolonged, thereby increasing the production flexibility and facilitating the mass production. In some alternative embodiments, when the process time of the nitridation treatment process is shortened to increase the throughput, the said protective layer is too thin to measure the thickness thereof. In such embodiment, the said nitridation treatment process will modify the surface composition of the pillar structures 240, so that the pillar structure 240 may include a central portion 240C and an edge portion 240E wrapping the central portion 240C, as shown in the enlarged view of FIG. 6A. Since the edge portion 240E of the pillar structure 240 is subjected by the said nitridation treatment process, the edge portion 240E has a nitrogen content greater than a nitrogen content of the central portion 240C. In other embodiments, the nitrogen content in pillar structure 240 gradually increases along a direction from the edge portion 240E of the pillar structure 240 toward the edge portion 240E of the pillar structure 240.

In some embodiments, the nitridation treatment may be performed by introducing a nitrogen gas in a flowrate of about 100 sccm to about 2000 sccm (e.g., 300 sccm). The nitridation treatment may include a plasma nitridation which is performed at pressure in a range of 5 mTorr to 100 mTorr (e.g., 15 mTorr), RF source power in a range of 300 W to 1200 W (e.g., 500 W), RF bias voltage in a range of 0 V to 50 V (e.g., 30 V), and process time in a range of 20 seconds to 600 seconds (e.g., 120 seconds). However, the embodiments of the present disclosure are not limited thereto, in other embodiments, the nitridation treatment may have other parameters to adjust.

Figure 7A:
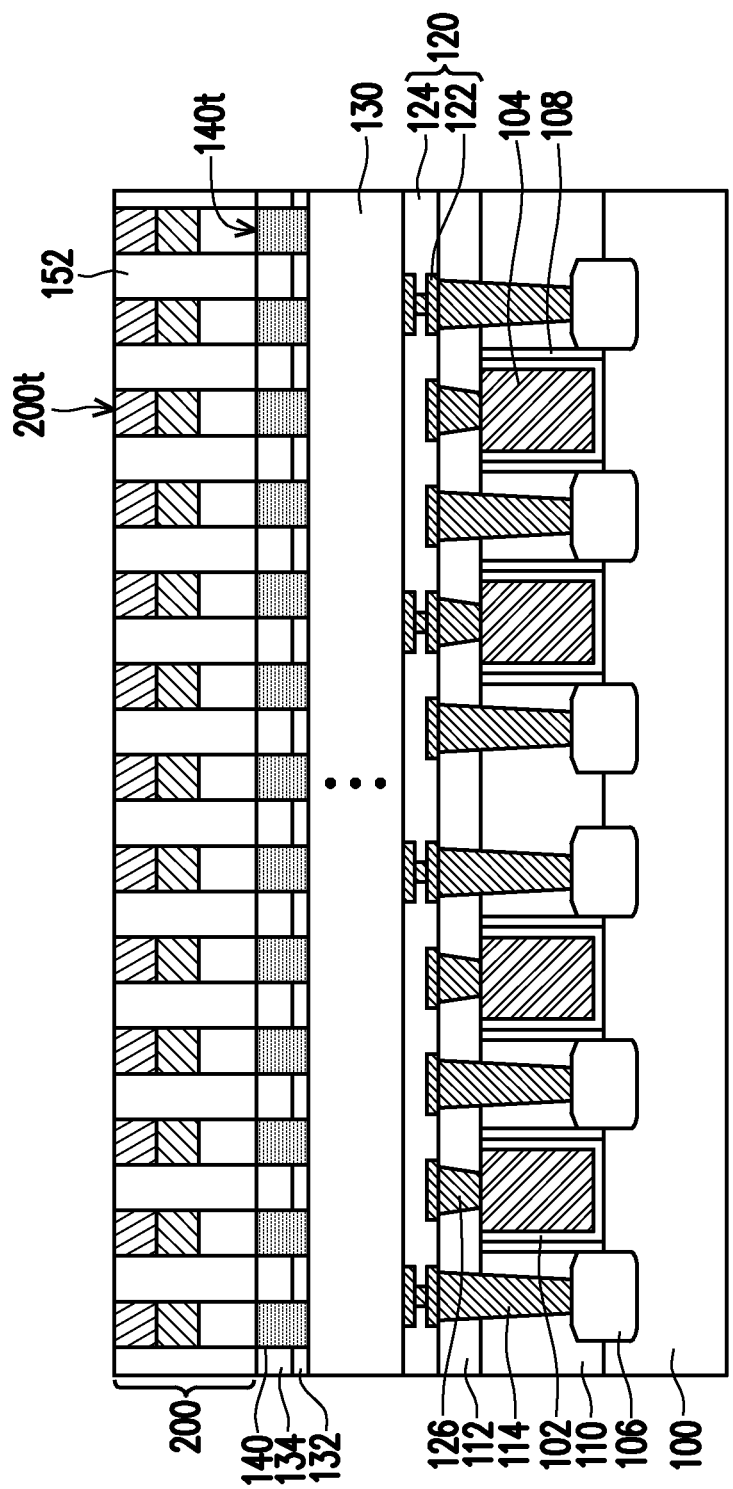
Figure 7B:
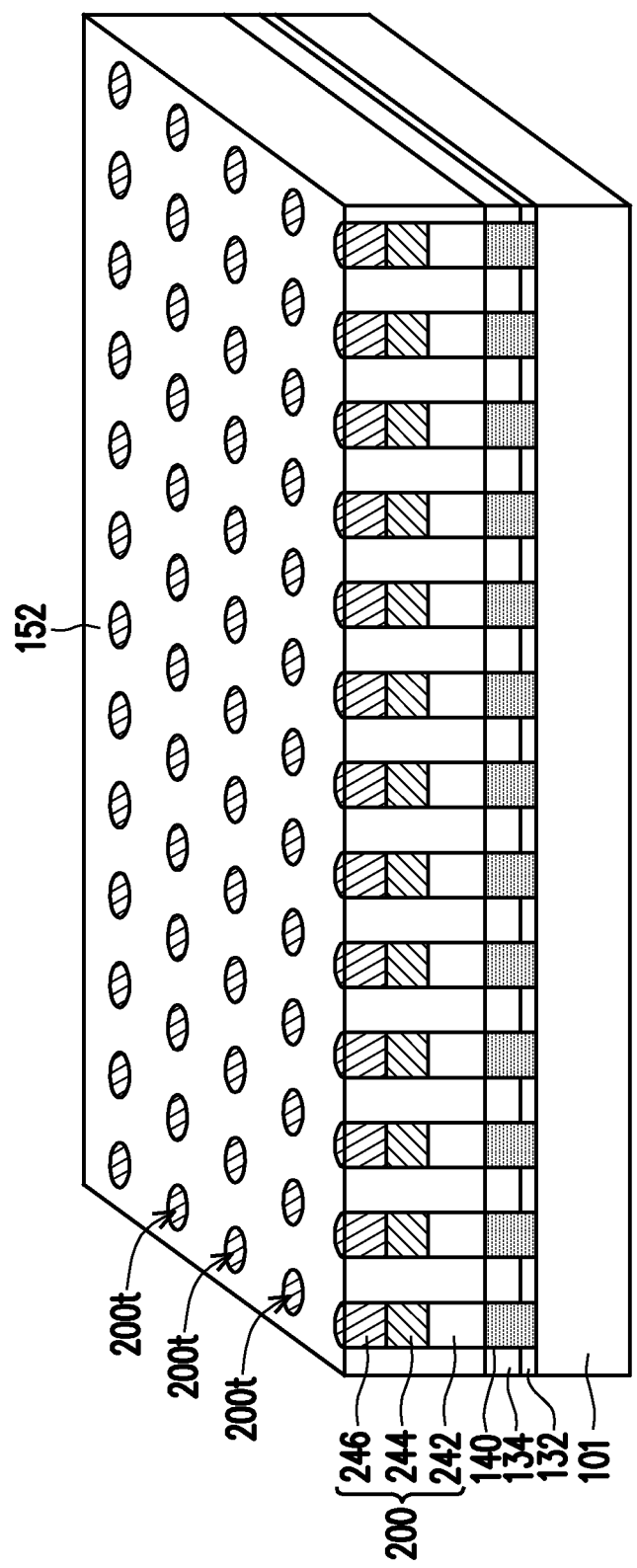

Referring to FIG. 7A and FIG. 7B, a dielectric layer (e.g., IMD layer) 152 is formed to fill between the pillar structures 240. In some embodiments, the dielectric layer 152 is formed by following steps. First, a dielectric material is formed to fill between the pillar structures 240 and extend to cover the top surfaces of the pillar structures 240. Thereafter, a planarization process (e.g., a CMP process) is performed to remove excessive dielectric material and the sacrificial layers 248, thereby exposing the top surfaces 200t of the memory pillars 200. In some embodiments, the dielectric material includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the second dielectric material 134 include one or more dielectric materials. In some embodiments, the dielectric material is formed by any suitable method, such as CVD, spin-on, or the like.

Figure 8B:
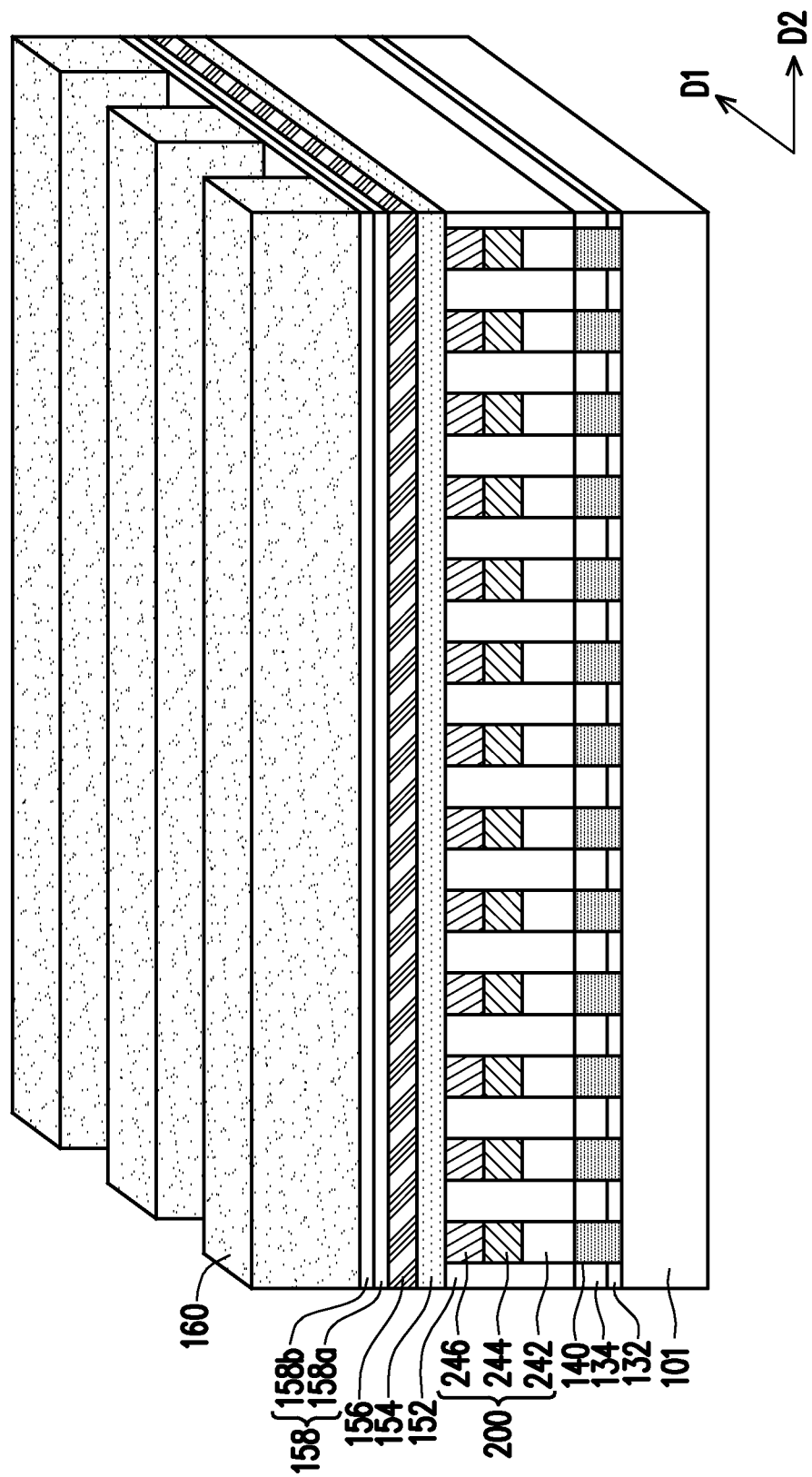

Referring to FIG. 8A and FIG. 8B, a selector 154, a conductive material 156, a hard mask 158, and a mask pattern 160 are sequentially formed on the top surfaces 200t of the memory pillars 200 and the dielectric layer 152.

In some embodiments, the selector 154 may be an ovonic threshold switch (OTS), which is a two-terminal symmetrical voltage sensitive switching device and may be characterized before it is used in a circuit device. The OTS mechanism includes in a switch between a high resistive (OFF state) at a low electric field and a low resistive state (ON state) when a specific voltage is obtained. For example, when an applied voltage that is less than a threshold voltage is applied one the selector 154, the selector 154 remains in an "off" state, e.g., an electrically nonconductive state. Alternatively, responsive to an applied voltage across the selector 154 that is greater than the threshold voltage, the selector 154 enters an "on" state, e.g., an electrically conductive state. That is, the selector 154 is referred to as a switch for determining to turn on or turn off the memory pillars 200. As such, the OTS may allow for bidirectional switching and may be easily integrated as a select device for a memory device.

In some embodiments, the selector 154 may be a binary OTS material such as TeC, TeB, GeSe, a ternary OTS material such as GeCTe, AsGeSe, GeSeN, GeSeTe, or GeSeSi, a quaternary OTS material such as TeAsGeSe, SiAsGeSe, or SiGeAsTe, a quinary OTS material such as SiTeAsGeSe, STeAsGeSe, or BTeAsGeSe, a senary OTS material such as BSiTeAsGeSe, a septenary OTS material such as NBSiTeAsGeSe, a octonary OTS material such as SNBSiTeAsGeSe, or other suitable materials. However, the embodiments of the present disclosure are not limited thereto. In other embodiments, other materials that can provide switching characteristics also be candidates for the material of the selector. Although the selector 154 illustrated in FIG. 8A is a single-layered structure, the embodiments of the present disclosure are not limited thereto. In some alternative embodiments, the selector 154 may be a bi-layered or multi-layered structure. In such embodiment, the selector 154 having the bi-layered or multi-layered structure may be designed to concentrate the passing current, thereby improving the switching performance.

It should be noted that the selector 154 is formed after the memory pillars 200 are formed. In such embodiment, the selector 154 will not suffer the etching damage in the patterning process of forming the memory pillars 200 (as shown in FIG. 6A and FIG. 6B). If the selector is damaged by the patterning process, the selector may lose the switching function or may become a high-resistance layer, so that the memory device having the damaged selector will not work. The said situation will become more serious when the size (diameter) of the memory cells becomes smaller or the density of the memory array becomes greater. In this case, in the present embodiment, the selector 154 is formed after performing the patterning process of forming the memory pillars 200, so that the selector 154 is protected from the etching damage. Accordingly, the native property and characteristics of the selector 154 may be maintained to enhance the performance of the memory device 10.

In some embodiments, the conductive material 156 may include Ti, Co, Cu, AlCu, W, TiN, TiW, TiAl, TiAlN, Ru, $RuO_x$, or a combination thereof, and may be formed by any suitable method, such as CVD, PVD, ALD, or the like.

In some embodiments, the hard mask 158 may include a bottom layer 158a and a middle layer 158b between the bottom layer 158a and the mask pattern 160. The bottom layer 158a may be used to protect the underlying structure in a subsequent etch process. In some embodiments, the bottom layer 158a includes an organic polymer free of silicon, and may be formed by CVD or the like. The middle layer 158b may include a silicon-containing layer designed to provide etch selectivity from the bottom layer 158a. In some embodiments, the middle layer 158b is also designed to function as a bottom anti-reflective coating that reduces reflection during a lithography exposure process, thereby increasing the imaging contrast and enhancing the imaging resolution.

In some embodiments, the mask pattern 160 includes a positive photoresist or a negative photoresist, and may be formed by any suitable method, such as spin-coating. As shown in the perspective view of FIG. 8B, the mask pattern 160 may include a plurality of strip patterns extending along the second direction D2 and spaced from each other in the first direction D1. The components in the underlying structure 101 under the bit lines 140 illustrated in FIG. 8B are omitted for clarity.

Referring to FIG. 9A, an etching process is performed by using the mask pattern 160 as a mask, so as to remove a portion of the hard mask 158 and a portion of the conductive material 156, thereby forming a plurality of word lines 256. As shown in the perspective view of FIG. 9B, the word lines 256 may replicate the shape of the mask pattern 160 and may be formed as strip patterns. That is, the word lines 256 also extend along the second direction D2 and spaced from each other in the first direction D1. In some embodiments, the etching process includes a dry etching process or an anisotropic etching process, such as reactive ion etching (RIE) process. The selector 154 may be used as an etching stop layer in the said etching process. In this case, a first portion of the selector 154 covered by the word lines 256 has a first top surface higher than or equal to a second top surface of a second portion of the selector 154 exposed by the word lines 256.

Figure 9B:
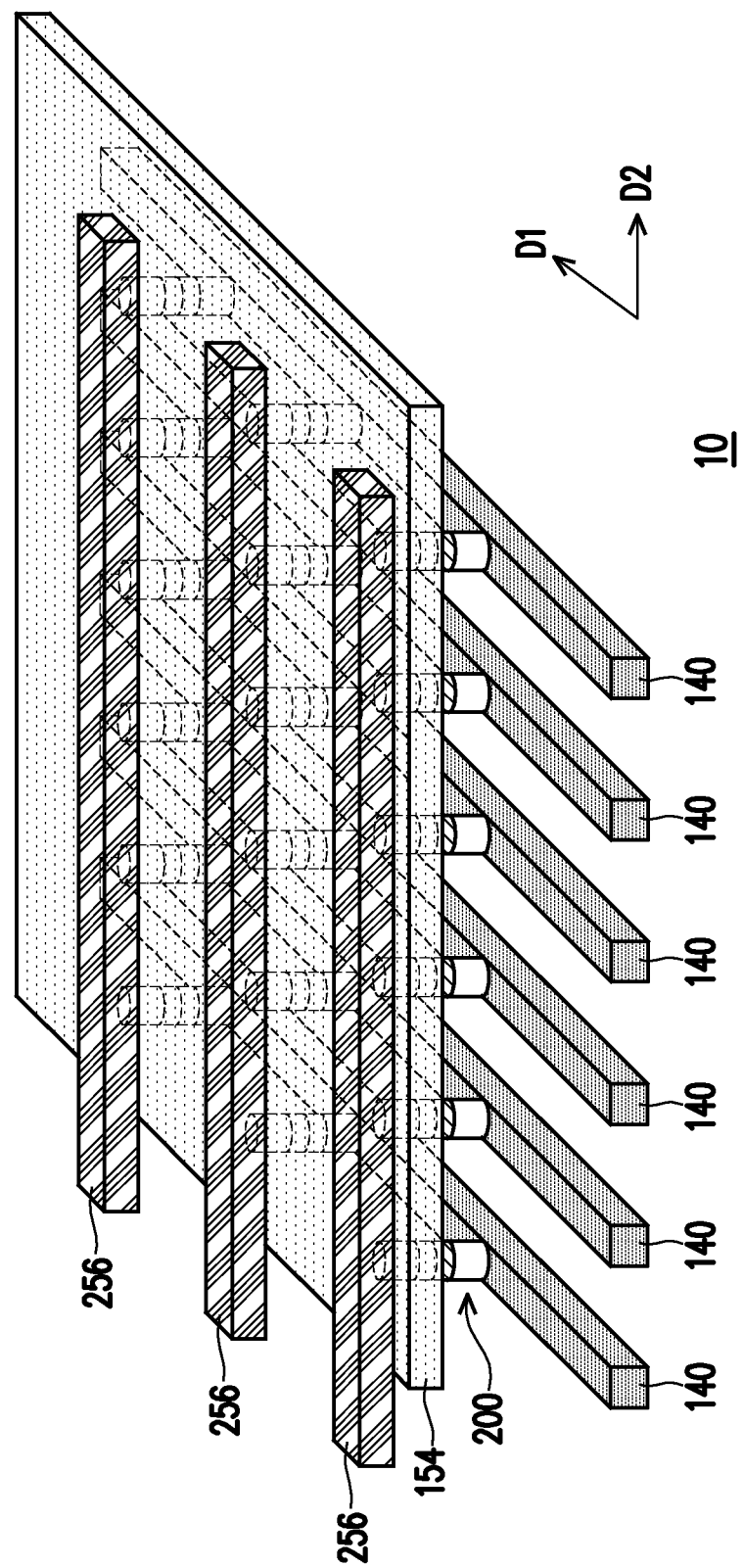

After removing the remaining mask pattern 160 and the hard mask 158, the word lines 256 are exposed to accomplish the semiconductor device 10 having the memory pillars 200, as shown in FIG. 9A. In detail, the semiconductor device 10 may include a plurality of bit lines 140 extending along the first direction D1; a plurality of word lines 256 extending along the second direction D2 different from the first direction D1; a plurality of memory pillars 200; and a selector 154. The word lines 256 may be disposed over the bit lines 140. The memory pillars 200 may be disposed between the bit lines 140 and the word lines 256, and respectively positioned at the intersections of the bit lines 140 and the word lines 256. In such embodiment, the memory pillars 200 may be arranged as an array including a plurality of rows and a plurality of columns, as shown in FIG. 9B. The perspective schematic view of FIG. 9B only illustrates the bit lines 140, the memory pillars 200, the selector 154, and the word lines 256, while other components are omitted.

It should be noted that the selector 154 is disposed between the memory pillars 200 and the word lines 256. That is, the selector 154 may be referred to as a selector plane overlying the top surface of the array including all of the memory pillars 200. From another perspective, the selector 154 may extend from a top surface of one memory pillar 200 to cover a top surface of an adjacent memory pillar 200, thereby covering the top surfaces of all memory pillars 200. In addition, the selector 154 may extend form the top surfaces of all memory pillars 200 to further cover the top surface of the dielectric layer 152, thereby forming a continuous structure. In such embodiment, all of the memory pillar 200 share the same selector 154 to form one selector-one resistor (1S1R) configuration.

In some embodiment, the 1S1R configuration may be disposed between the metal n (Mn) and the metal n−1 (Mn−1). That is, the selector 154 and the memory pillars 200 may be disposed between any two adjacent conductive layers in the back-end-of-line (BEOL) structure. For example, the selector 154 and the memory pillars 200 are disposed between the metal 3 (M3) and the metal 4 (M4). In this case, the bit lines 140 is at the same level with the M3, while the word lines 256 is at the same level with the M4. Also, the selector 154 and the memory pillars 200 may be disposed between the metal 4 (M4) and the metal 5 (M5), between the metal 5 (M5) and metal 6 (M6), and so on. Based on above, the fabricating process of the memory pillars may be compatible with the BEOL process of the semiconductor device, thereby simplifying process steps and efficiently improving the integration density.

In some embodiments, the storage element layer 242 includes a phase change material when the memory cell 200 is the PCM cell. When the storage element layer 242 is a phase change material layer (hereinafter referred to as the PCM layer 242), the PCM layer 242 has a variable phase representing a data bit. For example, the PCM layer 242 has a crystalline phase and an amorphous phase which are interchangeable. The crystalline phase and the amorphous phase may respectively represent a binary "1" and a binary "0", or vice versa. Accordingly, the PCM layer 242 has a variable resistance that changes with the variable phase of the PCM layer 242. For example, the PCM layer 242 has a high resistance in the amorphous phase and a low resistance in the crystalline phase.

In the operation of the PCM cell 200, the data state of the PCM cell 200 is read by measuring the resistance of the PCM cell 200 (i.e., the resistance from the bit line 140 to the word line 256). The phase of the PCM layer 242 represents the data state of the PCM cell 200, the resistance of the PCM layer 242, or the resistance of the PCM cell 200. Further, the data state of the PCM cell 200 may be set and reset by changing the phase of the PCM layer 242.

In some embodiments, the phase of the PCM layer 242 is changed by heating. For example, the bit line 140 heats the PCM layer 242 to a first temperature that induces crystallization of the PCM layer 242, so as to change the PCM layer 242 to the crystalline phase (e.g., to set the PCM cell 200). Similarly, the bit line 140 heats the PCM layer 242 to a second temperature that melts the PCM layer 242, so as to change the PCM layer 242 to the amorphous phase (e.g., to reset the PCM cell 200). The first temperature is lower than the second temperature. In some embodiments, the first temperature is 100° C. to 200° C. and the second temperature is 150° C. to 400° C.

The amount of heat generated by the bit line 140 varies in proportion to the current applied to the bottom electrode 204. That is, the PCM layer 242 is heated up to a temperature (i.e., the second temperature) higher than the melting temperature when a current passes through it. The temperature is then quickly dropped below the crystallization temperature. In the case, a portion of the PCM layer 242 contacting the bit line 140 is changed to the amorphous state with high resistivity, and thus the state of the PCM cell 200 is changed to a high resistance state. Then, the portion of the PCM layer 242 may be back to the crystalline state by heating up the PCM layer 242 to a temperature (i.e., the first temperature) higher than the crystallization temperature and lower than the melting temperature, for a certain period.

Embodiments are not limited to a particular storage element layer or storage element layers associated with the storage elements of the PCM cell. In some alternative embodiments, the storage element layer is used for a RRAM cell, a MRAM cell, a FeRAM cell, or a combination thereof. Since the operations of the said memory cells depend on the type of the storage element material, the operations of all memory cells will not be described in detail here.

In some alternative embodiment, the memory pillars 200 may be referred to as an array of switching cells. As shown in FIG. 9B, the array of switching cells may include a plurality of switching cells 200 arranged as a plurality of rows and a plurality of columns. A selector plane 154 may overlay the array of switching cells, so that all of the switching cells 200 are in contact with the selector plane 154. The semiconductor device 10 further includes a plurality of bit lines 140 contacting a lower surface of the array of switching cells 200, and a plurality of word lines 256 overlying the selector plane 154. That is, the selector plane 154 and the array of switching cells 200 are sandwiched between the bit lines 140 and the word lines 256. The switching cells 200 are respectively positioned at a plurality of intersections of the bit lines 140 and the word lines 256. In some embodiments, the bit lines 140 and the word lines 256 are electrically coupled to the drivers (e.g., word line (WL) drivers and bit line (BL) drivers), the sense amplifiers, or the like through the underlying interconnect structures 130 and 120. In some embodiments, the drivers, the sense amplifiers, or the like may be disposed directly under the array of switching cells 200 and illustrated as the transistor form in FIG. 9A. In some alternative embodiments, the drivers, the sense amplifiers, or the like may be disposed in the front-end-of-line (FEOL) structure outside the array the array of switching cells 200, and not shown in the cross-sectional views of FIG. 9A.

According to some embodiments, a memory device includes a plurality of bit lines extending along a first direction; a plurality of word lines extending along a second direction different from the first direction; a plurality of memory pillars; and a selector. The plurality of word lines are disposed over the plurality of bit lines. The plurality of memory pillars are disposed between the plurality of bit lines and the plurality of word lines, and respectively positioned at a plurality of intersections of the plurality of bit lines and the plurality of word lines. The selector is disposed between the plurality of memory pillar and the plurality of word lines. The selector extends from a top surface of one memory pillar to cover a top surface of an adjacent memory pillar. In some embodiments, the plurality of memory pillars are arranged as an array including a plurality of rows and a plurality of columns, and the selector overlays a top surface of the array. In some embodiments, one of the plurality of memory pillars comprises: a storage element layer contacting the plurality of bit lines; an electrode layer disposed on the storage element layer; and a buffer metal layer disposed on the electrode layer and contacting the selector. In some embodiments, the storage element layer, the electrode layer, and the buffer metal layer have sidewalls aligned to each other. In some embodiments, the memory device further includes a dielectric layer disposed between the plurality of memory pillars, wherein the selector further covers a top surface of the dielectric layer. In some embodiments, one of the plurality of memory pillars comprises: a central portion; and an edge portion wrapping the central portion, wherein the edge portion has a nitrogen content greater than a nitrogen content of the central portion. In some embodiments, the memory device comprises a magnetoresistive random-access memory (MRAM) device, a resistive random-access memory (RRAM) device, a ferroelectric random-access memory (FeRAM) cell, a phase change random-access memory (PCRAM), or a combination thereof.

According to some embodiments, a method of forming a memory device includes: forming a plurality of bit lines extending along a first direction on a substrate; sequentially forming a storage element material, an electrode material, and a buffer metal material on the plurality of bit lines; patterning the storage element material, the electrode material, and the buffer metal material to form a plurality of memory pillars; forming a dielectric material to fill between the plurality of memory pillars; performing a planarization process to remove a portion of the dielectric material thereby exposing a plurality of buffer metal layers of the plurality of memory pillars; sequentially forming a selector, a conductive material, and a mask pattern on top surfaces of the plurality of memory pillars; and removing a portion of the conductive material by using the mask pattern as a mask, so as to form a plurality of word lines extending along a second direction different from the first direction. In some embodiments, the method further includes: forming a sacrificial material on the buffer metal material, wherein the patterning the storage element material, the electrode material, and the buffer metal material further comprises patterning the sacrificial material to form a plurality of sacrificial layers on the plurality of memory pillars, and wherein the performing the planarization process further comprises removing the plurality of sacrificial layers. In some embodiments, after forming the plurality of memory pillars, the method further comprises performing a surface treatment, and the surface treatment at least comprise: performing a nitridation treatment process including introducing a nitrogen gas, so that an edge portion of the plurality of memory pillars has a nitrogen content greater than a nitrogen content of the central portion thereof. In some embodiments, after performing the nitridation treatment process, a protective layer is further formed to be continuously extending or discretely distributed on the surfaces of the plurality of memory pillars. In some embodiments, the forming the plurality of word lines comprises removing the portion of the conductive material by using the selector as a stop layer. In some embodiments, a first portion of the selector covered by the plurality of word lines has a first top surface higher than or equal to a second top surface of a second portion of the selector exposed by the plurality of word lines. In some embodiments, the plurality of memory pillars are arranged as an array including a plurality of rows and a plurality of columns, and the selector overlays a top surface of the array. In some embodiments, the selector extends from the top surfaces of the plurality of memory pillars to cover a top surface of the dielectric material thereby forming a continuous structure. In some embodiments, a material of the selector comprises: ovonic threshold switch (OTS) material or the like.

According to some embodiments, a semiconductor device includes an array of switching cells comprising a plurality of switching cells arranged as a plurality of rows and a plurality of columns; and a selector plane overlying the array of switching cells, so that the plurality of switching cells are in contact with the selector plane. In some embodiments, the semiconductor device further includes a plurality of bit lines contacting a lower surface of the array of switching cells and extending along a first direction; and a plurality of word lines overlying the selector plane and extending along a second direction different from the first direction, wherein the plurality of switching cells are respectively positioned at a plurality of intersections of the plurality of bit lines and the plurality of word lines. In some embodiments, the plurality of switching cells comprise a plurality of memory pillars, and one of the plurality of memory pillars comprises: a storage element layer contacting the plurality of bit lines; an electrode layer disposed on the storage element layer; and a buffer metal layer disposed on the electrode layer and contacting the selector plane. In some embodiments, the storage element layer, the electrode layer, and the buffer metal layer have sidewalls aligned to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a plurality of bit lines extending along a first direction;
   a plurality of word lines extending along a second direction different from the first direction, and disposed over the plurality of bit lines;
   a plurality of memory pillars disposed between the plurality of bit lines and the plurality of word lines, and respectively positioned at a plurality of intersections of the plurality of bit lines and the plurality of word lines, wherein one of the plurality of memory pillars comprises:
      a central portion; and
      an edge portion wrapping the central portion, wherein the edge portion has a nitrogen content greater than a nitrogen content of the central portion; and
   a selector disposed between the plurality of memory pillar and the plurality of word lines, wherein the selector extends from a top surface of one memory pillar to cover a top surface of an adjacent memory pillar.

2. The memory device of claim 1, wherein the plurality of memory pillars are arranged as an array including a plurality of rows and a plurality of columns, and the selector overlays a top surface of the array.

3. The memory device of claim 1, wherein one of the plurality of memory pillars comprises:
   a storage element layer contacting the plurality of bit lines;
   an electrode layer disposed on the storage element layer; and
   a buffer metal layer disposed on the electrode layer and contacting the selector.

4. The memory device of claim 3, wherein the storage element layer, the electrode layer, and the buffer metal layer have sidewalls aligned to each other.

5. The memory device of claim 1, further comprising a dielectric layer disposed between the plurality of memory pillars, wherein the selector further covers a top surface of the dielectric layer.

6. The memory device of claim 1, wherein the memory device comprises a magnetoresistive random-access memory (MRAM) device, a resistive random-access memory (RRAM) device, a ferroelectric random-access memory (FeRAM) cell, a phase change random-access memory (PCRAM), or a combination thereof.

7. The memory device of claim 1, wherein the selector comprises a homogeneous and continuous ovonic threshold switch (OTS) layer, and the plurality of memory pillars are connected to a same OTS layer.

8. A semiconductor device, comprising:
   an array of switching cells comprising a plurality of switching cells arranged as a plurality of rows and a plurality of columns; and
   a selector plane overlying the array of switching cells, so that the plurality of switching cells are in contact with the selector plane, wherein the selector plane comprises a homogeneous and continuous ovonic threshold switch (OTS) layer, and the plurality of switching cells are connected to a same OTS layer.

9. The semiconductor device of claim 8, further comprising:
   a plurality of bit lines contacting a lower surface of the array of switching cells and extending along a first direction; and
   a plurality of word lines overlying the selector plane and extending along a second direction different from the first direction, wherein the plurality of switching cells are respectively positioned at a plurality of intersections of the plurality of bit lines and the plurality of word lines.

10. The semiconductor device of claim 9, wherein the plurality of switching cells comprise a plurality of memory pillars, and one of the plurality of memory pillars comprises:
    a storage element layer contacting the plurality of bit lines;
    an electrode layer disposed on the storage element layer; and
    a buffer metal layer disposed on the electrode layer and contacting the selector plane.

11. The semiconductor device of claim 10, wherein the storage element layer, the electrode layer, and the buffer metal layer have sidewalls aligned to each other.

12. A method of forming a memory device, comprising:
    forming a plurality of bit lines extending along a first direction on a substrate;
    sequentially forming a storage element material, an electrode material, and a buffer metal material on the plurality of bit lines;
    patterning the storage element material, the electrode material, and the buffer metal material to form a plurality of memory pillars;

after forming the plurality of memory pillars, performing a surface treatment, so that one of the plurality of memory pillars comprises:
a central portion; and
an edge portion wrapping the central portion, wherein the edge portion has a nitrogen content greater than a nitrogen content of the central portion;
forming a dielectric material to fill between the plurality of memory pillars;
performing a planarization process to remove a portion of the dielectric material thereby exposing a plurality of buffer metal layers of the plurality of memory pillars;
sequentially forming a selector, a conductive material, and a mask pattern on top surfaces of the plurality of memory pillars; and
removing a portion of the conductive material by using the mask pattern as a mask, so as to form a plurality of word lines extending along a second direction different from the first direction.

13. The method of claim 12, further comprising:
forming a sacrificial material on the buffer metal material,
wherein the patterning the storage element material, the electrode material, and the buffer metal material further comprises patterning the sacrificial material to form a plurality of sacrificial layers on the plurality of memory pillars, and
wherein the performing the planarization process further comprises removing the plurality of sacrificial layers.

14. The method of claim 12, wherein the surface treatment at least comprises:
performing a nitridation treatment process including introducing a nitrogen gas.

15. The method of claim 14, wherein after performing the nitridation treatment process, a protective layer is further formed to be continuously extending or discretely distributed on the surfaces of the plurality of memory pillars.

16. The method of claim 12, wherein the forming the plurality of word lines comprises removing the portion of the conductive material by using the selector as a stop layer.

17. The method of claim 16, wherein a first portion of the selector covered by the plurality of word lines has a first top surface higher than or equal to a second top surface of a second portion of the selector exposed by the plurality of word lines.

18. The method of claim 12, wherein the plurality of memory pillars are arranged as an array including a plurality of rows and a plurality of columns, and the selector overlays a top surface of the array.

19. The method of claim 12, wherein the selector extends from the top surfaces of the plurality of memory pillars to cover a top surface of the dielectric material thereby forming a continuous structure.

20. The method of claim 12, wherein a material of the selector comprises: ovonic threshold switch (OTS) material.

* * * * *